United States Patent
Wang et al.

(10) Patent No.: US 7,951,723 B2
(45) Date of Patent: May 31, 2011

(54) INTEGRATED ETCH AND SUPERCRITICAL $CO_2$ PROCESS AND CHAMBER DESIGN

(75) Inventors: Ching-Ya Wang, Hsin-Chu (TW); Weng-Jin Wu, Hsinchu (TW); Henry Lo, Hsinchu (TW); Jean Wang, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 617 days.

(21) Appl. No.: 11/552,364

(22) Filed: Oct. 24, 2006

(65) Prior Publication Data

US 2008/0108223 A1    May 8, 2008

(51) Int. Cl.
*H01L 21/461* (2006.01)

(52) U.S. Cl. . 438/725; 438/490; 438/700; 257/E21.231; 257/E21.236; 257/E21.237; 216/49; 216/83

(58) Field of Classification Search .......... 438/490, 438/700, 725, FOR. 103; 257/E21.231, E21.236, 257/E21.237; 216/49, 83
See application file for complete search history.

(56) References Cited

U.S. PATENT DOCUMENTS

| | | | |
|---|---|---|---|
| 4,474,994 A | 10/1984 | Makin | |
| 5,185,296 A | 2/1993 | Morita et al. | |
| 5,304,515 A | 4/1994 | Morita et al. | |
| 5,369,033 A | 11/1994 | Di Milia et al. | |
| 5,403,621 A | 4/1995 | Jackson et al. | |
| 5,685,527 A | 11/1997 | Harbali et al. | |
| 5,710,187 A | 1/1998 | Steckle, Jr. et al. | |
| 5,868,862 A | 2/1999 | Douglas et al. | |
| 5,908,510 A | 6/1999 | McCullough et al. | |
| 5,914,183 A | 6/1999 | Canham | |
| 6,260,562 B1 | 7/2001 | Morinishi et al. | |
| 6,306,564 B1 | 10/2001 | Mullee | |
| 6,329,017 B1 | 12/2001 | Liu et al. | |
| 6,440,337 B1 | 8/2002 | Hanna et al. | |
| 6,444,715 B1 | 9/2002 | Mukherjee et al. | |
| 6,486,078 B1 | 11/2002 | Rangarajan et al. | |
| 6,692,903 B2 * | 2/2004 | Chen et al. | 430/329 |
| 6,764,552 B1 | 7/2004 | Joyce et al. | |
| 6,848,458 B1 | 2/2005 | Shrinivasan et al. | |
| 7,351,635 B2 * | 4/2008 | Han et al. | 438/253 |
| 2003/0033676 A1 | 2/2003 | DeYoung et al. | |

(Continued)

FOREIGN PATENT DOCUMENTS

WO    WO-0211191    2/2002

OTHER PUBLICATIONS

Taiwanese Patent Office, Office Action dated Mar. 16, 2011, Application No. 10020217240, 6 pages.

*Primary Examiner* — Julio J Maldonado
*Assistant Examiner* — Su C Kim
(74) *Attorney, Agent, or Firm* — Haynes and Boone, LLP

(57) ABSTRACT

A method and apparatus involve providing a substrate having a dielectric layer formed thereon, forming a photoresist mask over the dielectric layer, the photoresist mask defining an opening, etching the dielectric layer through the at least one opening in the photoresist mask, treating a portion of the photoresist mask with an etching species, and removing the treated photoresist mask with a supercritical fluid. The etching, treating, and removing can be performed in one chamber.

20 Claims, 8 Drawing Sheets

U.S. PATENT DOCUMENTS

| | | |
|---|---|---|
| 2003/0116176 A1 | 6/2003 | Rothman et al. |
| 2003/0236004 A1* | 12/2003 | Sung et al. .................... 438/795 |
| 2004/0003828 A1 | 1/2004 | Jackson |
| 2004/0070045 A1* | 4/2004 | Suguro et al. ................. 257/506 |
| 2004/0216762 A1* | 11/2004 | Lo et al. ............................ 134/2 |
| 2005/0067673 A1* | 3/2005 | Geffken et al. ............... 257/573 |
| 2005/0124516 A1* | 6/2005 | Davenhall et al. ............ 510/175 |
| 2005/0158664 A1* | 7/2005 | Tseng et al. ................... 430/313 |
| 2006/0003593 A1* | 1/2006 | Huang ........................... 438/745 |
| 2006/0223300 A1* | 10/2006 | Simka et al. .................. 438/618 |
| 2006/0231930 A1* | 10/2006 | Araki et al. .................... 257/643 |
| 2007/0232047 A1* | 10/2007 | Fukasawa et al. ............. 438/597 |

* cited by examiner

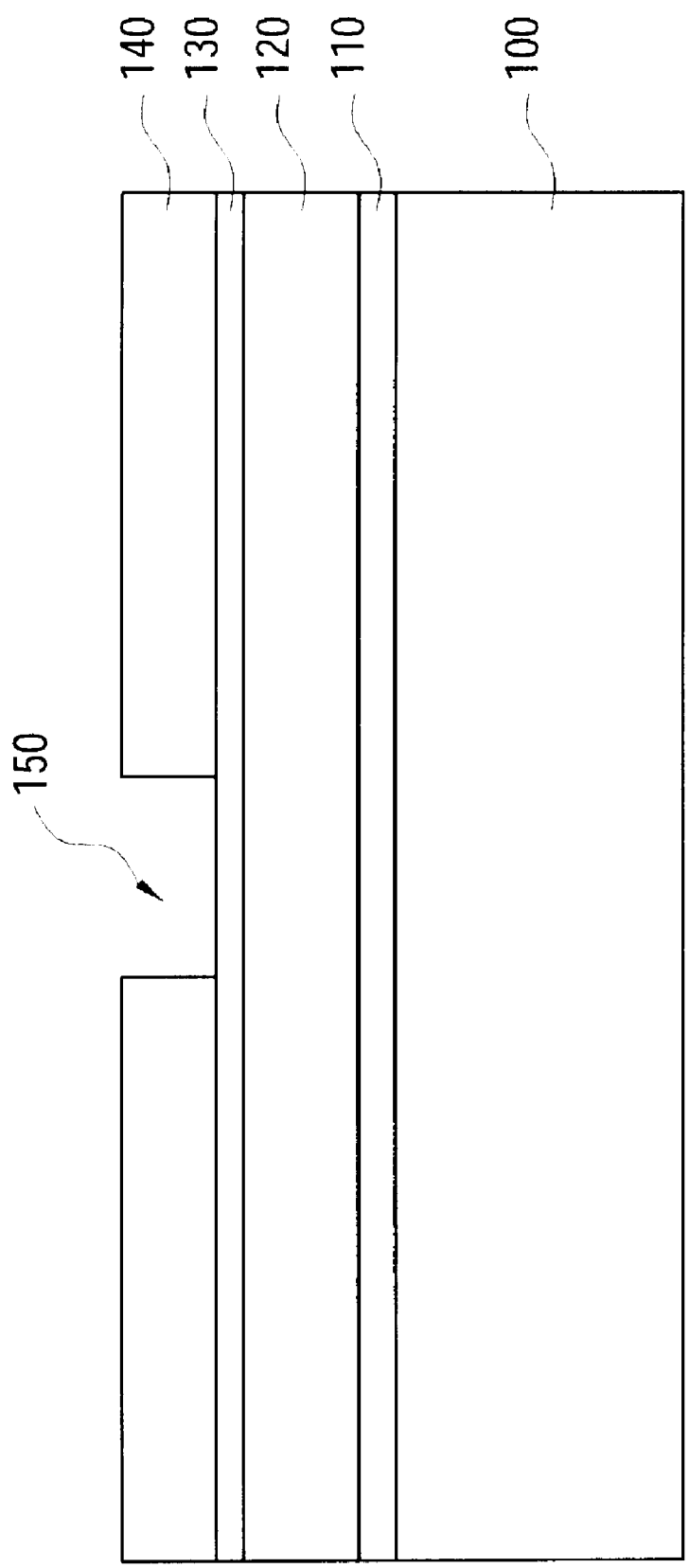

INTEGRATED ETCH AND SUPERCRITICAL CO$_2$ PROCESS AND CHAMBER DESIGN

BACKGROUND

The present disclosure relates generally to semiconductor processing, and more particularly to a method for removing photoresist residue from a surface of a semiconductor wafer.

Semiconductor device geometries have dramatically decreased in size since such devices were introduced several decades ago. Since then, integrated circuits have generally followed the two year/half-size rule (often called Moore's Law), which means that the number of devices on a chip doubles every two years. Today's fabrication plants are routinely producing devices having 0.13 μm and even 90 nm feature sizes and smaller. In the process of reducing the sizes of integrated circuits, it has been necessary to employ conductive materials having low resistivity and insulating materials having low dielectric constants to reduce the capacitive coupling between adjacent metal lines.

A damascene process is often used to form metal interconnections within integrated circuits. The process involves creating interconnect lines by first etching a trench or canal in a planar low-k dielectric layer and then filling that trench with metal, such as copper. In dual damascene processing, a second level is provided where a series of holes (e.g., contacts or vias) are etched and filled in addition to the trench. These processes are repeated many times over in order to meet the requirements for multi-level high density wiring formation. However, it has been shown that oxygen-containing plasmas in an ashing step to remove a photoresist after etching cause the low-k dielectric layer to degrade and increase the k value of the dielectric layer. What is needed is a simple and cost-effective method for stripping the photoresist without damaging the dielectric layer.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

FIGS. 1a-1f are cross-sectional side views of a semiconductor wafer at respective sequential stages as the wafer is being processed according to an embodiment of the present disclosure.

DETAILED DESCRIPTION

Figure 1B:
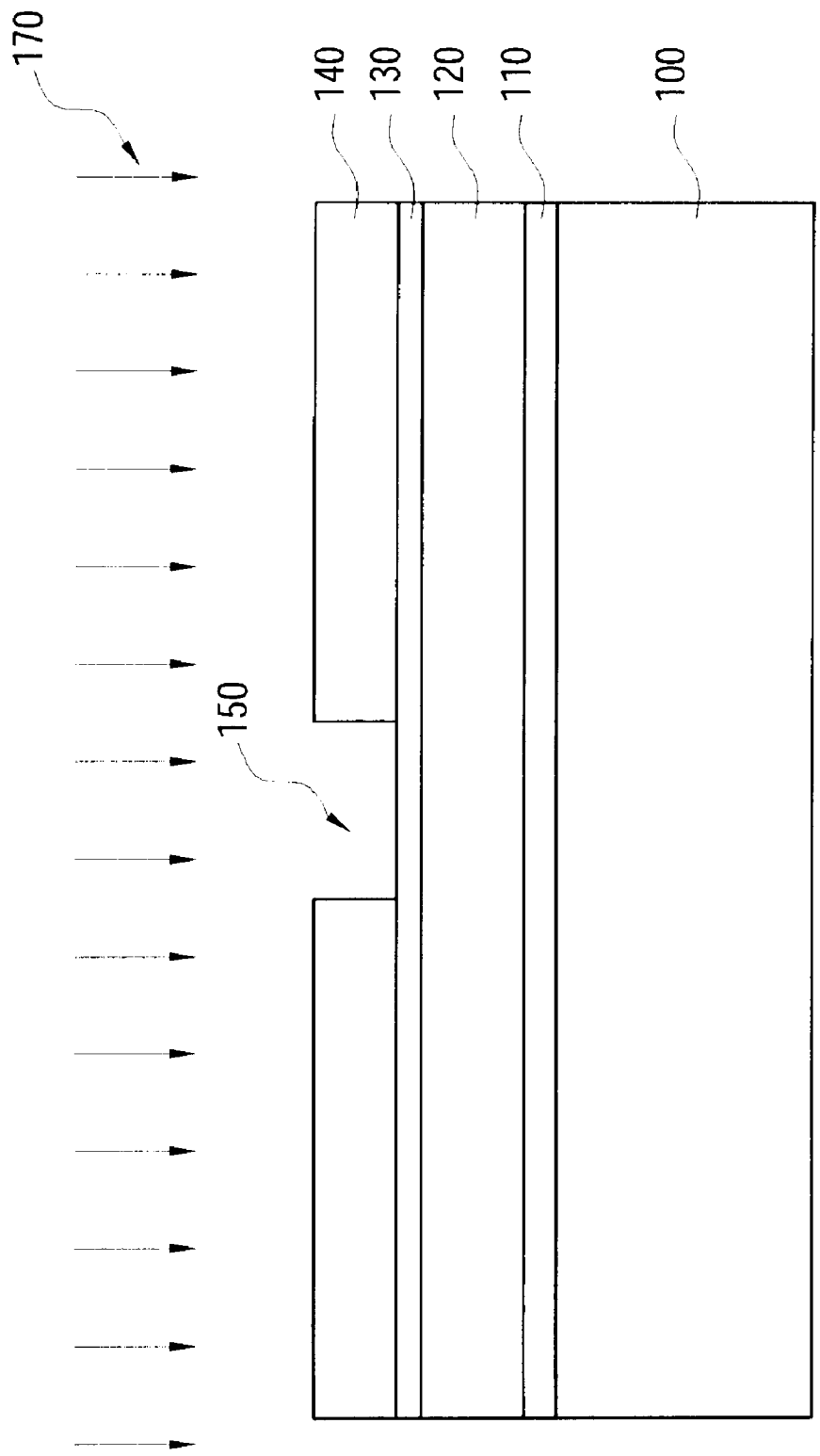

For the purpose of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, which does not by itself indicate a requirement that features of one embodiment apply to another embodiment, even if they share the same reference number.

Referring to FIGS. 1a-1f, illustrated are cross-sectional side views of a semiconductor wafer at respective sequential stages as the wafer is being processed. Starting with FIG. 1a, a semiconductor substrate 100 is a silicon substrate. However, the substrate 100 may alternatively be a germanium substrate or any other suitable material. Furthermore, the substrate 100 may include a compound semiconductor such as silicon carbide, gallium arsenic, indium arsenide, or indium phosphide. Moreover, semiconductor arrangements such as silicon-on-insulator (SOI) and/or an epitaxial layer may alternatively be provided. The substrate 100 contains a variety of active or passive elements (not shown), such as, transistors, diodes, resistors, capacitors, and other suitable elements for integrated circuits.

An etching stop layer 110 is formed over the substrate 100 by a conventional chemical vapor deposition (CVD) method. The etching stop layer 110 is silicon nitride. However, the etching stop layer 110 may alternatively be a silicon oxynitride, silicon carbide, or any combination thereof.

A dielectric layer 120 is formed over the etching stop layer 110. The dielectric layer 120 is a low-k fluoride-doped silicate glass (FSG), where k is the dielectric constant. However, the dielectric layer 120 may alternatively be polyimide, Black Diamond® (a product of Applied Materials of Santa Clara, Calif.), Xerogel, Aerogel, amorphous fluorinated carbon, and/or any other suitable porous low-k material. The dielectric layer 120 is formed on the substrate by a chemical vapor deposition (CVD) process. Alternatively, the dielectric layer may be formed by a low-pressure CVD (LPCVD), plasma-enhanced CVD (PECVD), high-density plasma CVD (HD-PCVD), or by spin coating or other suitable process.

The dielectric layer 120 is employed as an intermetal dielectric (IMD) layer or interlayer dielectric (ILD) for forming interconnect lines between elements within the substrate 100. For simplicity and clarity, one IMD layer is presently described in a damascene process. However, it is understood that the integrated circuit may alternatively contain more than one IMD layer as well as other insulating and metal layers for interconnecting the active and passive elements within the substrate 100.

A bottom anti-reflective coating (BARC) 130 is formed over the dielectric layer 120 by any of a variety of methods, such as spin coating or chemical vapor deposition (CVD). The BARC layer 130 is a silicon oxynitride. However, the BARC layer 130 may alternatively be a silicon oxycarbide, silicon nitride, tantalum nitride, or any other suitable material.

A photoresist mask layer 140 is formed over the BARC layer 130. The photoresist mask layer 140 has an opening 150 patterned therein by a photolithography process (not shown). The photolithography process patterns the photoresist mask layer 140 by exposing the photoresist to a radiation source through a mask (or reticle). The photoresist 140 is a positive photoresist. Alternatively, the photoresist may be a negative photoresist or other suitable material. The radiation source is a suitable light source such as an ultra-violet (UV), deep ultra-violet (DUV), or extreme ultra-violet (EUV) source. For example, the radiation source can be, but is not limited to, a mercury lamp having a wavelength of 436 nm (G-line) or 365 nm (I-line); a krypton fluoride (KrF) excimer laser with wavelength of 248 nm; an argon fluoride (ArF) excimer laser with a wavelength of 193 nm; a fluoride ($F_2$) excimer laser with a wavelength of 157 nm; or other light sources having a wavelength below approximately 100 nm. The photoresist is developed by an alkaline developer, so that exposed portions of the photoresist are removed, leaving the opening 150 in the photoresist mask 140. It is understood that various techniques are available for patterning, and that photolithography is only one example.

Figure 1C:
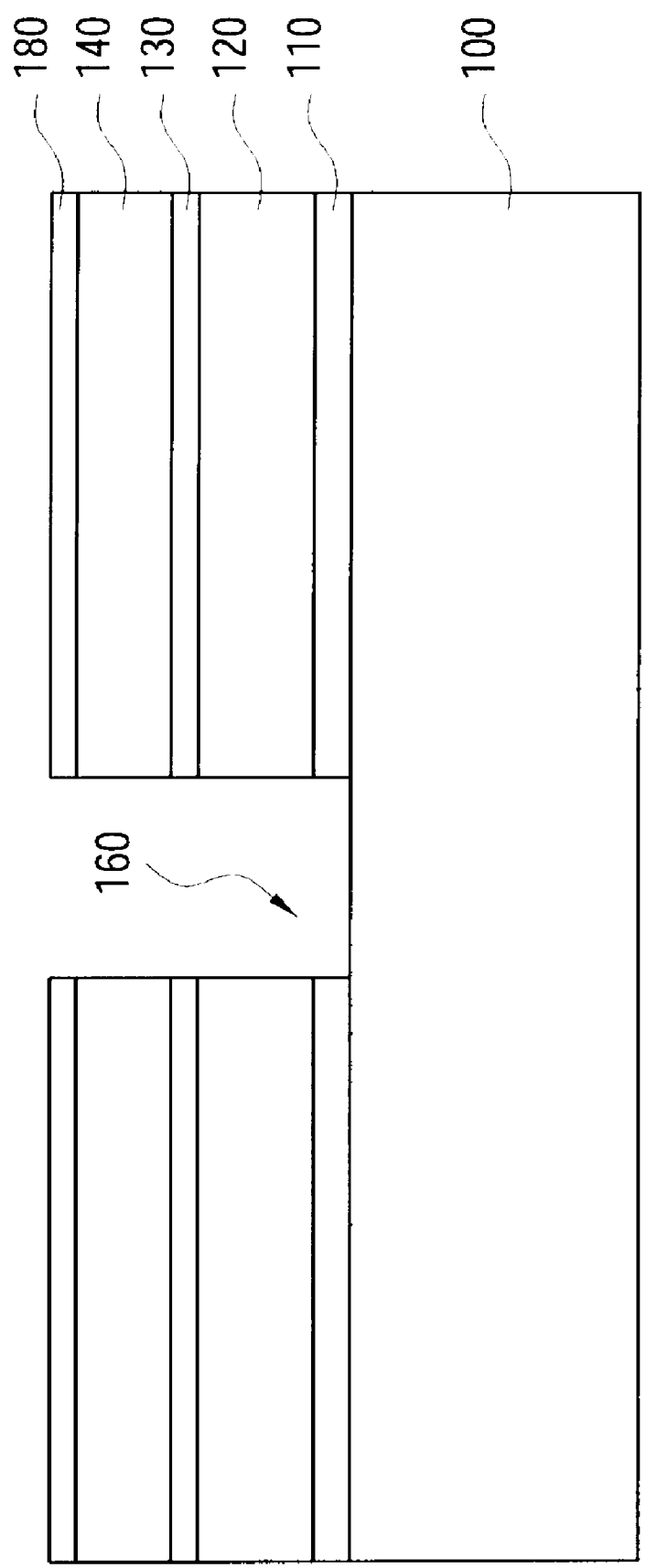

Referring now also to FIGS. 1b and 1c, a trench 160 (FIG. 1c) is formed in the dielectric layer 120 using the photoresist mask 140 layer with the opening 150. The opening 150, exposes a portion of the BARC layer 130. A dry etching process (not shown) is performed to remove the exposed portion of the BARC layer 130 to form an etched BARC layer. However, the etched BARC layer may alternatively be etched by a wet etch process, chemical etch process, or other suitable process. The trench 160 is then formed by a reactive ion etching (RIE) process 170 performed on the dielectric layer 120. Alternatively, the trench etching may be a continuation of the process used to etch the BARC layer 130, or some other suitable type of removal process.

During the reactive ion etching (RIE) of the dielectric layer 120, ion bombardment of the photoresist mask layer 140 causes the outermost layer of the mask to harden and a crust layer 180 is formed. The crust layer 180 is difficult to dissolve and requires aggressive chemistries to be used for removing the photoresist mask 140. For the sake of example, an existing method includes an oxygen plasma ash process to strip the photoresist mask 140 from the substrate 100. Using a plasma source, a reactive species is generated to combine with the photoresist to form ash which is then removed with a vacuum pump. However, it has been shown that using oxygen as the reactive species will degrade and damage porous low-k materials being used as the dielectric layer 120. The oxidizing plasma ash process depletes carbon from the low-k material and thereby increases its k value. Moreover, the oxidizing plasma ash process causes the surface of the dielectric layer 120 to be more absorbent to moisture.

A supercritical fluid is any substance at a temperature and pressure above its thermodynamic critical point. For example, supercritical carbon dioxide ($CO_2$) is achieved at a temperature greater than about 31° C. and at a pressure greater than about 73 atmospheres. In a supercritical state, $CO_2$ is an inert solvent with a liquid-like density, a gas-like diffusivity and viscosity, and an effective surface tension of near to zero. Thus, supercritical $CO_2$ can be used to effectively remove the photoresist mask 140 layer even as feature sizes continue to shrink. More importantly, supercritical $CO_2$ is highly compatible with porous low-k dielectric materials.

However, supercritical $CO_2$ cannot easily remove the hard crust layer 180 of the photoresist mask 140. One option is to use aggressive chemistries to oxidize the crust layer 180 and prepare it for a supercritical $CO_2$ ash process. Aggressive chemistries are expensive and will increase the cost of fabrication. Another option is to use ozone to oxidize the crust layer 180 and prepare it for the supercritical $CO_2$ ash process. The ozone process is time consuming, and a separate ozone chamber may be required. Furthermore, the ozone may potentially damage the dielectric layer 120 during the process.

Figure 1D:
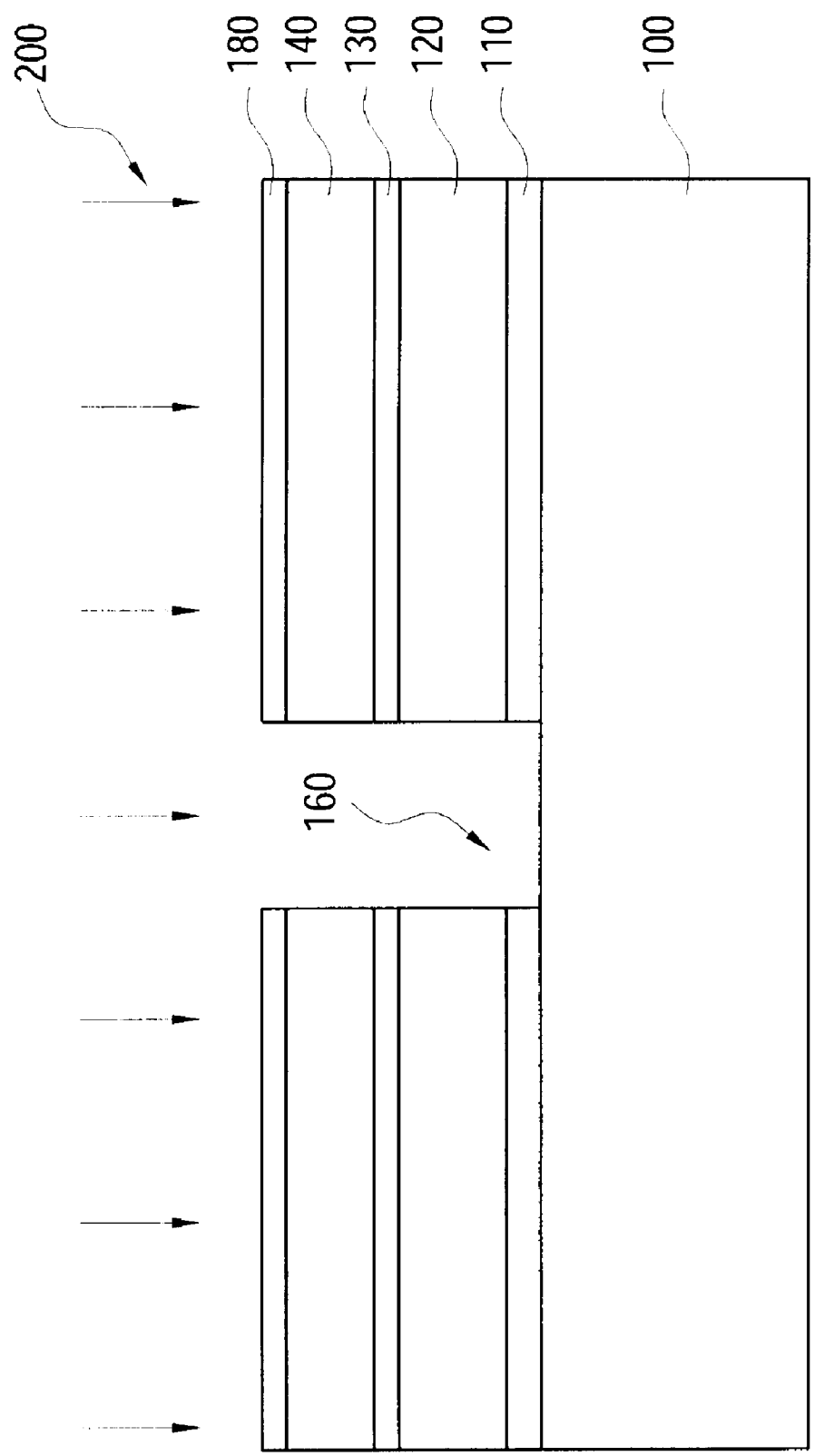

Referring now to FIG. 1d, an additional etching species treatment 200 is performed on the crust layer 180 to soften the crust and prepare the photoresist mask 140 for a supercritical fluid ash process. The treatment 200 utilizes an oxidizing plasma (that generates a very dilute etching species) and a short processing time to soften the crust layer 180 without damaging the low-k dielectric layer 120. The treatment 200 is performed in the same processing chamber as the supercritical fluid ash process that follows below.

Figure 1E:
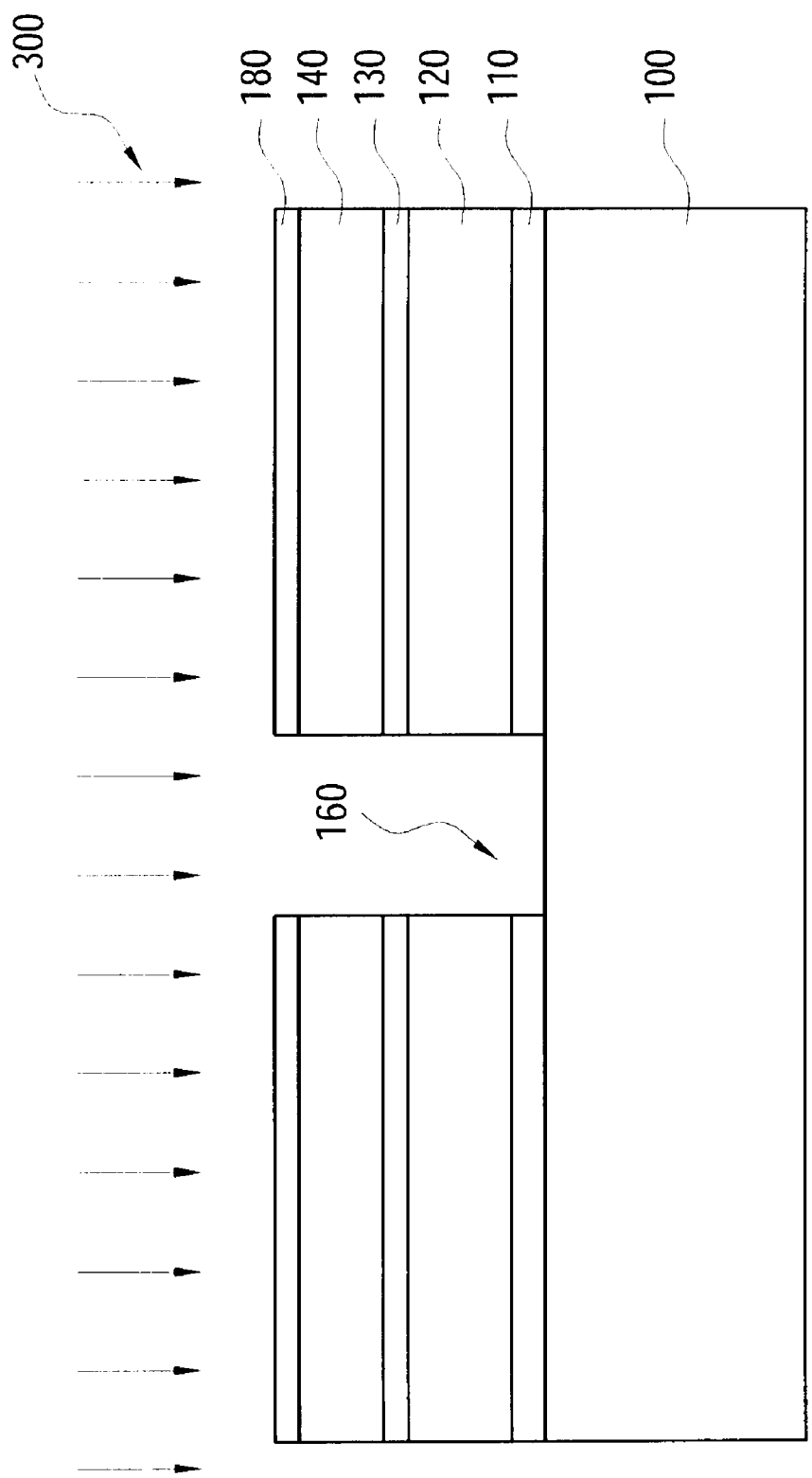

Referring now to FIG. 1e, a supercritical fluid ash process 300 is performed on the photoresist mask 140 including the crust layer 180 to remove the entire mask from the substrate 100. For the sake of example, the supercritical $CO_2$ ash process is performed in the same processing chamber as the etch process discussed above. The supercritical $CO_2$ ash process is conducted at conventional temperatures and pressures above a critical point (e.g., above 31° C. and 73 atm) for $CO_2$. The supercritical $CO_2$ will have liquid-like density and gas-like diffusivity and viscosity which enhances its capabilities as a stripping fluid for sub-micron surface features. Because of the additional etching species treatment 200 discussed above, the processing time to remove the photoresist mask 140 with supercritical $CO_2$ will be shortened. Alternatively, the supercritical $CO_2$ may include a stripper chemical, such as hydrofluoric acid (HF) and/or other suitable solvents, which is dissolved therein to aid in removing the photoresist mask 140.

As discussed above, the treatment process 200 and the supercritical fluid ash process 300 are performed in the same processing chamber. Therefore, the processing time for etching and stripping the photoresist mask 140 from the substrate 100 will be shortened since there is no need to transfer the wafer from one chamber to the next. Additionally, utilizing one chamber for both processes will save on operating costs as well as physical space within the manufacturing footprint.

Figure 1F:
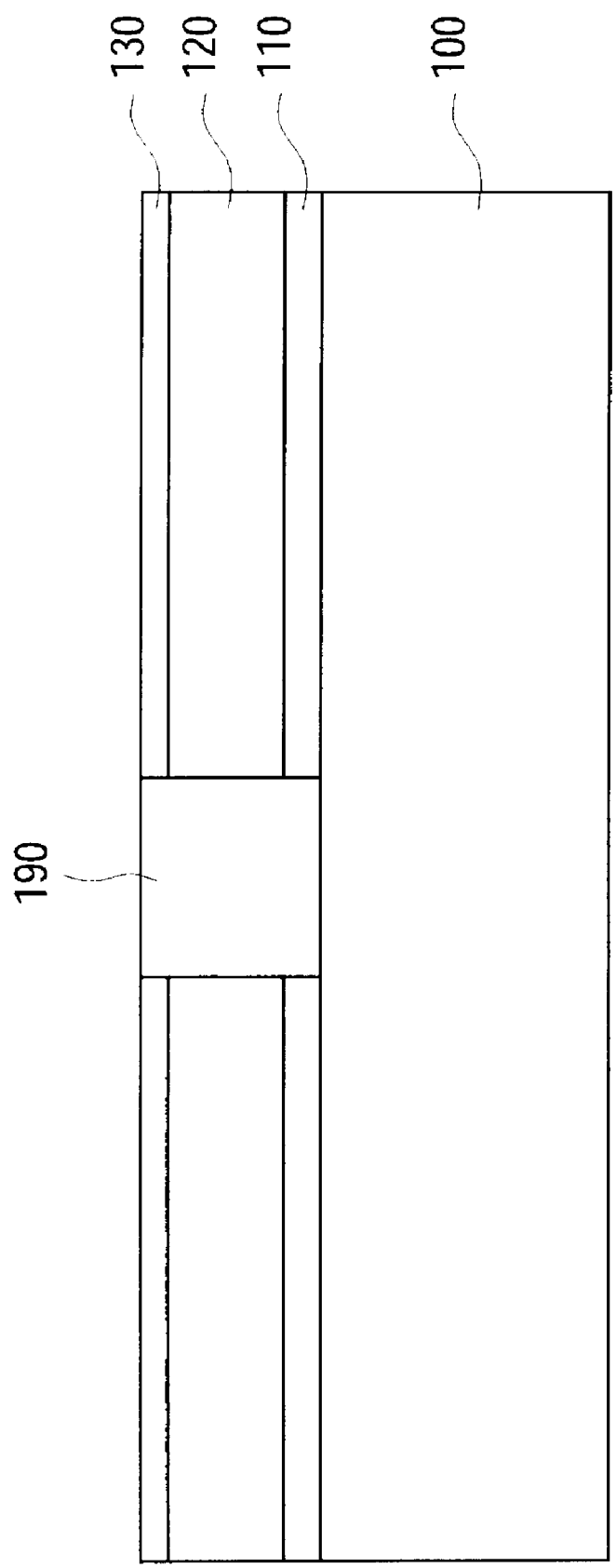

Referring now also to FIG. 1f, after removal of the photoresist mask 140 (FIG. 1e), the substrate 100 continues with conventional processing steps to complete formation of the metal interconnect lines, such as filling the trench 160 with a conductive layer 190 of copper, and planarizing the conductive layer and dielectric layer 120. It is understood that while the embodiments of the present disclosure are explained with reference to formation of metal interconnect structures in a damascene process, this is not intended to limit the scope of the present disclosure. Those skilled in the art will appreciate that the method is generally applicable to other processes involving removal of photoresist residue and/or post-etching photoresist by-products from semiconductor substrates.

Figure 2:
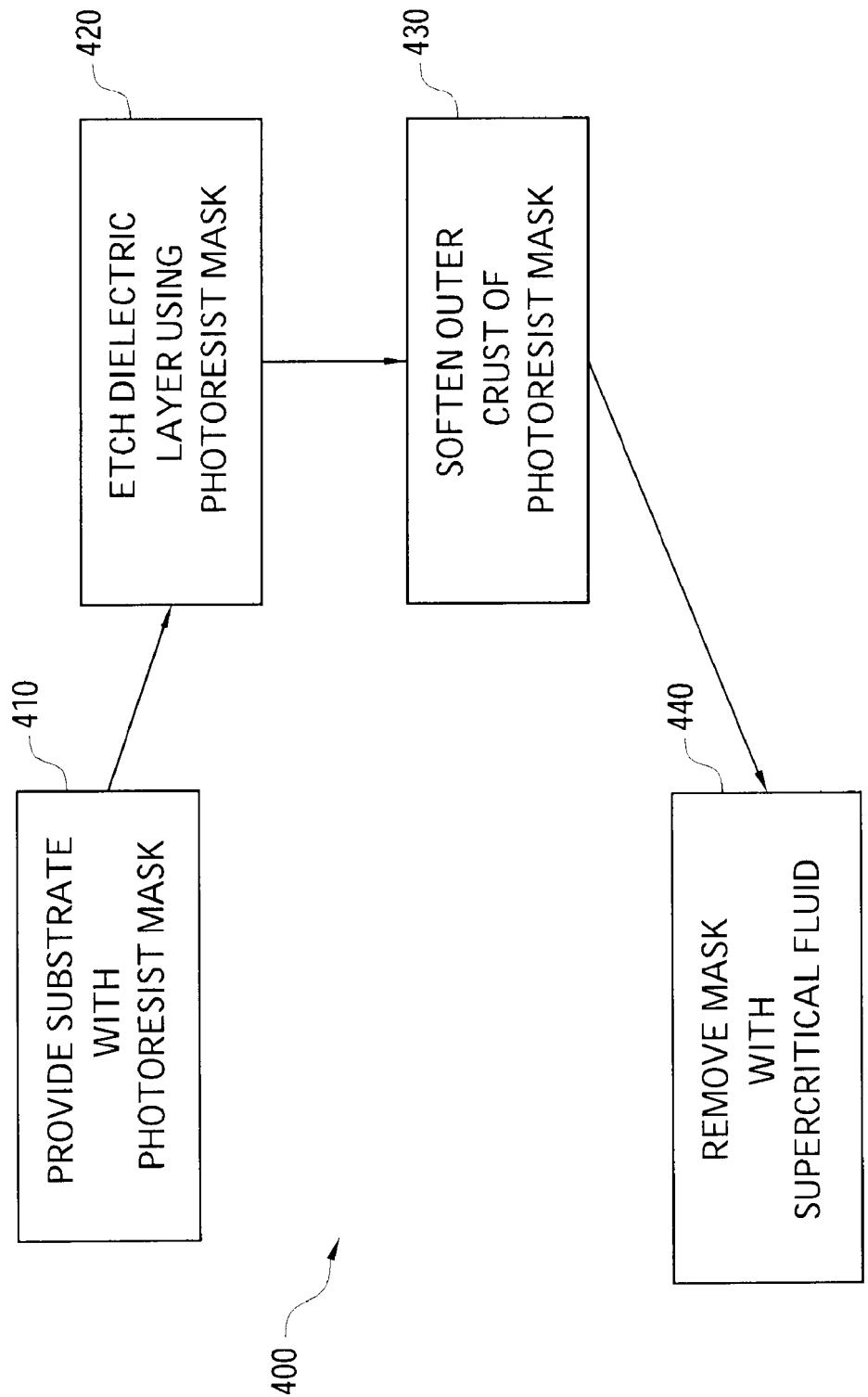
FIG. 2 is a flow chart of a method for implementing the process illustrated in FIGS. 1a-1f.

Referring now to FIG. 2, illustrated is a flow chart of a method 400 for implementing an embodiment of the present disclosure. The method 400 begins with block 410 in which a substrate having a photoresist mask formed thereon is provided. The photoresist mask has an opening for etching a dielectric layer. The method 400 proceeds with block 420 in which the uncovered portion of the dielectric layer is etched away by an etching process, such as a reactive ion etching (RIE) process. The method 400 proceeds with block 430 in which the outer crust of the photoresist mask is softened by treating the photoresist mask with an oxidizing plasma. The method 400 proceeds with block 440 in which the treated photoresist mask is stripped and removed from the substrate by a supercritical fluid ash process, such as supercritical $CO_2$. After the photoresist mask is removed, the method continues with conventional processing steps, such as filling the regions etched in the dielectric layer with a conductive material to form an interconnecting structure. One of the many advantages is that the same processing chamber is used to implement this entire method 400.

Figure 3:
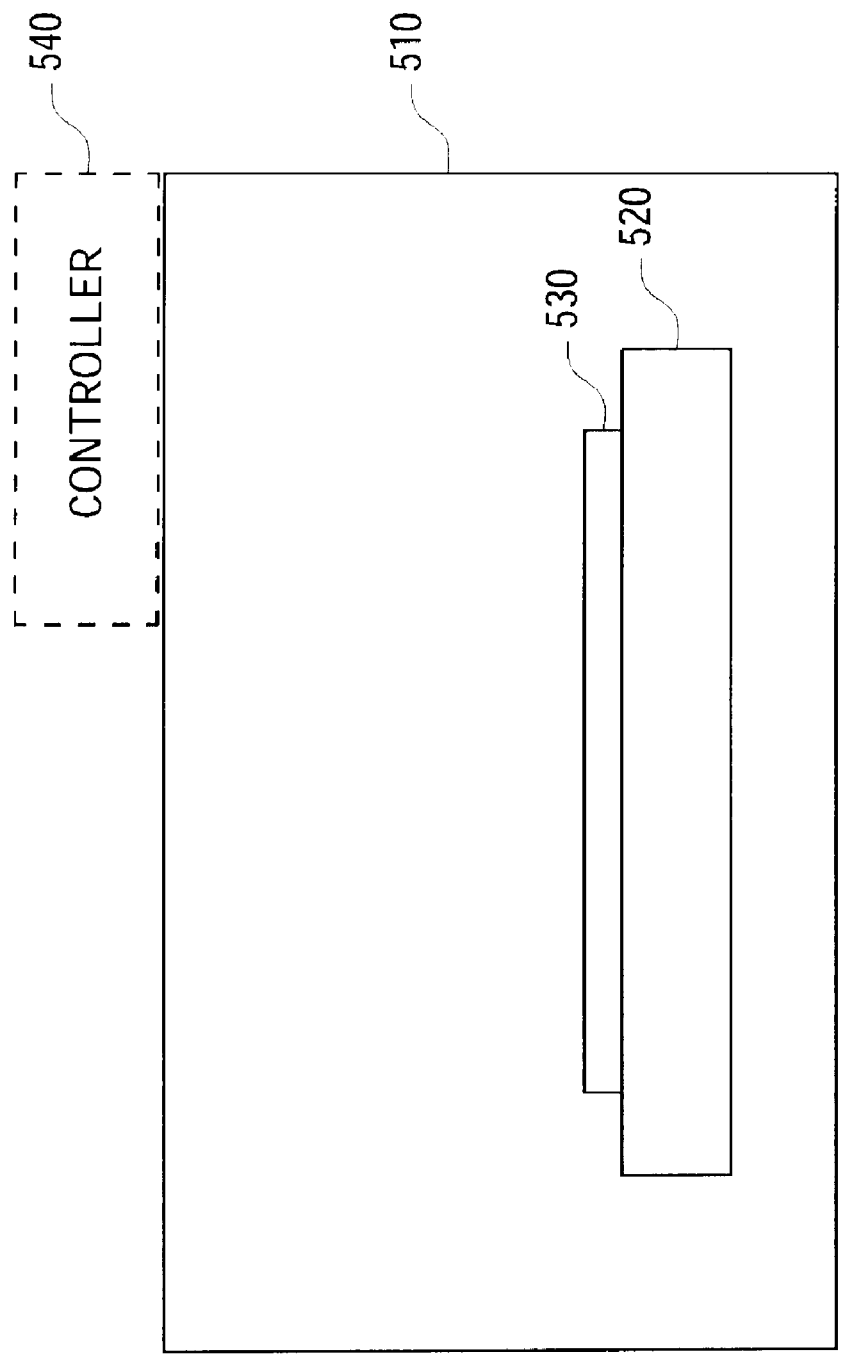
FIG. 3 is a block diagram of an apparatus for performing the method of FIG. 2.

FIG. 3 is a block diagram of an apparatus 500 for performing the method 400 of FIG. 2. The apparatus 500 includes a processing chamber 510, a stage 520 for supporting a semiconductor wafer 530 for processing, and a controller 540. The semiconductor wafer 530 is provided with a photoresist mask pattern formed thereon. The controller 540 operates and configures the processing chamber 510 to perform an etching process, such as a trench or via etching, using the photoresist mask pattern. The etching process includes a plasma etching process, such as a reactive ion etching (RIE) process. After the trench or via etching, the controller 540 operates and configures the processing chamber 510 to treat the photoresist mask with an additional etching species to soften a portion of the photoresist mask. The etching species is generated in the processing chamber 510 by an oxidizing plasma. The controller 540 then operates and configures the processing chamber 510 to strip and remove the photoresist mask with a supercritical fluid, such as supercritical carbon dioxide ($CO_2$). For supercritical $CO_2$, the controller 540 maintains the processing chamber 510 at a temperature greater than about 31° and at a pressure greater than about 73 atm.

Thus, one embodiment is a method for removing photoresist without damaging porous low-k dielectric material. The method comprises providing a substrate having a dielectric layer formed thereon, forming a photoresist mask over the dielectric layer, the photoresist mask defining an opening, etching the dielectric layer through the opening in the photoresist mask, treating a portion of the photoresist mask with an etching species, and removing the treated photoresist mask with a supercritical fluid. In some embodiments, the etching includes configuring the supercritical fluid to include supercritical carbon dioxide ($CO_2$).

In other embodiments, the etching includes configuring the supercritical fluid to include supercritical carbon dioxide ($CO_2$) with a stripper chemical dissolved therein. In other embodiments, the etching of the dielectric layer is by a reactive ion etching (RIE). In other embodiments, the providing includes configuring the dielectric layer to include a low-k dielectric material. In other embodiments, the providing includes configuring the dielectric layer to include an intermetal dielectric (IMD) layer. In still other embodiments, the method further comprises filling a region etched in the dielectric layer with a conductive material to form an interconnecting structure. In other embodiments, the treating includes generating an etching species with an oxidizing plasma.

Also, another embodiment is a method for removing a photoresist mask formed on a semiconductor substrate. The method comprises providing a semiconductor substrate having a photoresist mask formed thereon, etching the semiconductor substrate through the photoresist mask, treating an outer crust of the photoresist mask with an etching species, wherein the etching species softens the outer crust of the photoresist mask, and stripping the treated photoresist mask from the semiconductor substrate with a supercritical fluid. The etching, treating, and stripping are performed in one chamber. In some embodiments, the stripping includes configuring the supercritical fluid to include supercritical carbon dioxide ($CO_2$). In some embodiments, the stripping includes configuring the supercritical fluid to include supercritical carbon dioxide ($CO_2$) with a stripper chemical dissolved therein. In some other embodiments, the treating includes generating an etching species with an oxidizing plasma. In still other embodiments, the treating includes configuring the etching species to include a diluted etching species. In other embodiments, the providing includes configuring the photoresist mask to include a pattern for etching the semiconductor substrate.

Also, another embodiment is an apparatus comprising a processing chamber. The processing chamber includes a stage for supporting a semiconductor substrate and a controller for operating and configuring the processing chamber. The processing chamber is operable and configured to perform an etching process, to perform a treating process, and to perform a stripping process with a supercritical fluid.

In some embodiments, the processing chamber is configured to carry out a reactive ion etching (RIE) process. In some embodiments, the processing chamber is configured to use an oxidizing plasma during the treating process. In some embodiments, the processing chamber is configured to use supercritical carbon dioxide ($CO_2$) during the stripping process. The controller maintains the processing chamber at a temperature greater than about 31° C. and at a pressure greater than about 73 atm to effect the stripping process.

Although embodiments of the present disclosure have been described in detail, those skilled in the art should understand that they can make various changes, substitutions and alterations without departing from the spirit and scope of the present disclosure. It is understood that various different combinations of the above listed processing steps can be used in combination or in parallel. Also, features illustrated and discussed above with respect to some embodiments can be combined with features illustrated and discussed above with respect to other embodiments. Accordingly, all such modifications are intended to be included within the scope of this disclosure.

Several different advantages exist from these and other embodiments. In addition to providing an effective and efficient method for removing photoresist without damaging low-k dielectric layers, the method does so without consuming aggressive chemistries or the use of ozone. Moreover, the method may be carried out in one processing chamber that handles both the etching and photoresist stripping processes. This will reduce the cost and processing time for semiconductor manufacture.

What is claimed is:

1. A method comprising:
providing a substrate having a dielectric layer formed thereon;
forming a photoresist mask over the dielectric layer, the photoresist mask defining an opening;
etching to remove a portion of the dielectric layer through the opening in the photoresist mask;
treating, after the etching, a portion of the photoresist mask with an etching species to soften the portion of the photoresist mask; and
removing the treated photoresist mask with a supercritical fluid.

2. The method of claim 1, wherein the removing includes configuring the supercritical fluid to include supercritical carbon dioxide ($CO_2$).

3. The method of claim 1, wherein the removing includes configuring the supercritical fluid to include supercritical carbon dioxide ($CO_2$) with a stripper chemical dissolved therein.

4. The method of claim 1, wherein the etching of the dielectric layer includes reactive ion etching (RIE).

5. The method of claim 1, wherein the providing includes configuring the dielectric layer to include a low-k dielectric material.

6. The method of claim 1, wherein the providing includes configuring the dielectric layer to include an intermetal dielectric (IMD) layer.

7. The method of claim 6, further comprising filling a region etched in the dielectric layer with a conductive material to form an interconnecting structure.

8. The method of claim 1, wherein the treating includes generating the etching species with an oxidizing plasma.

9. A method comprising:
providing a substrate having a photoresist mask formed thereon;

etching to remove a portion of the substrate through the photoresist mask, causing the photoresist mask to develop an outer crust;

treating, after etching, the outer crust of the photoresist mask with an etching species, wherein the etching species softens the outer crust of the photoresist mask; and stripping the treated photoresist mask from the substrate with a supercritical fluid;

wherein the etching, treating, and stripping are performed in one chamber.

10. The method of claim 9, wherein the stripping includes configuring the supercritical fluid to include supercritical carbon dioxide ($CO_2$).

11. The method of claim 9, wherein the stripping includes configuring the supercritical fluid to include supercritical carbon dioxide ($CO_2$) with a stripper chemical dissolved therein.

12. The method of claim 9, wherein the treating includes generating the etching species with an oxidizing plasma.

13. The method of claim 9, wherein the treating includes configuring the etching species to include a diluted etching species.

14. The method of claim 9, wherein the providing includes configuring the photoresist mask to define an opening for etching the substrate.

15. A method for processing a substrate having a material layer formed thereon, the method comprising:

forming a patterned photoresist layer over the material layer;

etching portions of the material layer that are exposed through the patterned photoresist layer, the etching includes reactive ion etching (RIE);

treating, after the etching, the patterned photoresist layer with an oxidizing plasma that softens the patterned photoresist layer; and stripping the treated patterned photoresist layer using supercritical carbon dioxide with a stripper chemical;

wherein the treating and stripping is performed in a same processing chamber.

16. The method of claim 15, wherein the treating includes generating a diluted etching species from the oxidizing plasma.

17. The method of claim 15, including:

forming a bottom antireflective coating (BARC) layer on the material layer prior to forming the patterned photoresist layer; and etching portions of the BARC layer that are exposed through the patterned photoresist layer, the etching portions of the BARC layer is performed by a different process from the etching portions of the material layer.

18. The method of claim 15, wherein the etching is performed in the same processing chamber as the treating and stripping.

19. The method of claim 15, including selecting the material layer to include a low-k dielectric material.

20. The method of claim 15, including selecting the material layer to include an intermetal dielectric (IMD) layer.

* * * * *